United States Patent [19]

Kashimura

[11] Patent Number: 4,661,728
[45] Date of Patent: Apr. 28, 1987

[54] PROGRAMMABLE LOGIC ARRAY CIRCUIT
[75] Inventor: Masahiko Kashimura, Tokyo, Japan
[73] Assignee: NEC Corporation, Japan
[21] Appl. No.: 774,684
[22] Filed: Sep. 11, 1985
[30] Foreign Application Priority Data
 Sep. 12, 1984 [JP] Japan .................. 59-190912
[51] Int. Cl.⁴ .................. H03K 19/096; G06F 7/38
[52] U.S. Cl. .................. 307/468; 307/452; 307/469; 307/481
[58] Field of Search .................. 307/452–453, 307/468–469, 481–482, 578, 475; 364/716; 365/203, 204

[56] References Cited
U.S. PATENT DOCUMENTS
3,866,186 2/1975 Suzuki .................. 307/452

Primary Examiner—Stanley D. Miller
Assistant Examiner—M. R. Wambach
Attorney, Agent, or Firm—Sughrue, Mion, Zinn, Macpeak and Seas

[57] ABSTRACT

A programmable logic array (PLA) circuit includes a product term array and a sum term array. The product term array is coupled to the sum term array via a control transistor. A gate electrode of the control transistor is coupled to an output of the product term array, and a source (or drain) electrode is coupled to an input end of the sum term array. A drain (or source) electrode of the control transistor is coupled to a power source. N-channel type transistors are employed in the product term and the sum term arrays, while a P-channel type transistor is employed as the control transistor.

6 Claims, 5 Drawing Figures

PROGRAMMABLE LOGIC ARRAY CIRCUIT

BACKGROUND OF THE INVENTION

1. Field of the Invention

The present invention relates to a semiconductor circuit having a programmable logic array (PLA), and particularly to a programmable logic array circuit including P-channel transistors and N-channel transistors.

2. Description of the Prior Art

A programmable logic array (hereinafter called PLA) circuit basically includes two blocks, one that is a sum term array (an OR array) block and the other that is a product term (an AND array) block. To reduce power consumption, complementary circuits are employed in the two array blocks, for example, N-channel transistors are provided in the product term array, while P-channel transistors are provided in the sum term array. In this case, a predetermined number of N-channel transistors are connected to each product term line in series, while all gate electrodes of P-chanel transistors are connected to the product term line in parallel. As a result, gate capacitances corresponding to the number of P-channel transistors connected to the product term line are directly coupled to the product term line. Therefore, a long period of time must be spent to discharge electricity on the product term line. In addition, since all drain electrodes of the P-channel transistors are connected in common to a sum term line coupled to an output terminal, a decision of an output level must be delayed by drain capacitances. Therefore, a shortcoming of the conventional PLA circuit is that the response speed of the circuit is slow. In particular, where the product term lines and/or the sum term lines increase in number, the operation speed of the PLA circuit is slowed down significantly.

Further, the operation speed of the PLA circuit depends on the number of P-channel transistors to be connected to the product term line as described above and, in particular, on the discharge speed of the product term line to which most P-channel transistors are connected. However, since the number of P-channel transistors to be connected to the product term line is determined by a program to be set in the PLA circuit, the operation speed of the PLA circuit is not known until the program is determined. In an integrated circuit above, such as a microprocessor, a plurality of PLA circuits are employed. For example, an execution unit requires a PLA circuit for converting an instruction code of one type to a code of another type. In a bus control unit, a PLA circuit is used as a decoder for selecting a register to be accessed. In an instruction decoding unit, a PLA circuit is useful as an operand selector. However, as described above, since the PLA operation speed is unknown, a logic design of the microprocessor is made difficult and the design of a timing control unit generating timing signals for controlling input/output timings of a signal becomes particularly difficult. For correct operation of the microprocessor, the timing control must depend on the PLA circuit with the slowest speed, thus preventing the design of a microprocessor capable of a high-speed operation.

SUMMARY OF THE INVENTION

An object of the present invention is to provide a programmable logic array circuit with a quick response and low power consumption.

Another object of the present invention is to provide an improved PLA circuit adaptable to a high-speed microprocessor.

Still another object of the present invention is to provide a PLA circuit in which an electric signal stored on a product term line can be discharged at a high speed and the discharge speed is constant regardless of the number of transistors connected to the product term line in parallel.

A programmable logic array (PLA) circuit according to the present invention includes a product term (AND) array and a sum term (OR) array. The output terminal of the product term array is coupled to an input electrode of a control transistor whose source (or drain) electrode is coupled to the input of the sum term array. The drain (or source) electrode of the control transistors is coupled to a power source. In other words, the product term array is coupled to the sum term array via the control transistor. A control transistor is inserted between each product term output end and the respective sum term input end.

In the PLA circuit of the present invention, transistors employed in the product term array and transistors employed in the sum term array are the same conductivity type transistors, for example N-channel transistors. However, the control transistor has a different conductivity from that of the transistors in the product term array and the sum term array. If N-channel transistors are employed in the product term array and in the sum term array, a P-channel transistors is used as the control transistor. The P-channel transistor is controlled by the output of the product term array. In this case, when all N-channel transistors connected in series to a product term line are turned on in response to input data applied to a plurality of input terminals, the P-channel transistor operating as the control transistor is turned on. Thus the power source is coupled to the input end of the sum term array. As a result, in this case, all N-channel transistors connected in parallel to the input end are turned on.

According to the present invention, each output end of the product term array is not directly connected to the input end of the sum term array, but is connected to a gate electrode of the corresponding control transistor, through which the input end of the sum term array is operatively coupled to the power source. Since the output end of the product term array is isolated from gate capacitance of a plurality of transistors in the sum term array, capacitance of the output end of the product term array is extremely reduced. Therefore, the output level of the product term array can be determined at a high speed.

Further, N-channel transistors can be employed in the sum term array. A mutual conductance (gm) of the N-channel transistor is larger than that of the P-channel transistor. Therefore, if the same drain capacitsance is that of the P-channel transistor is added to the sum term line, the signal propagation speed becomes high.

As described above, according to the present invention, a PLA circuit with a high speed operation can be provided. Moreover, since a gate capacitance coupled to each product term line is constant, the operation speed of the PLA circuit may be determined indepen-

DETAILED DESCRIPTION OF THE EMBODIMENTS

Figure 1:
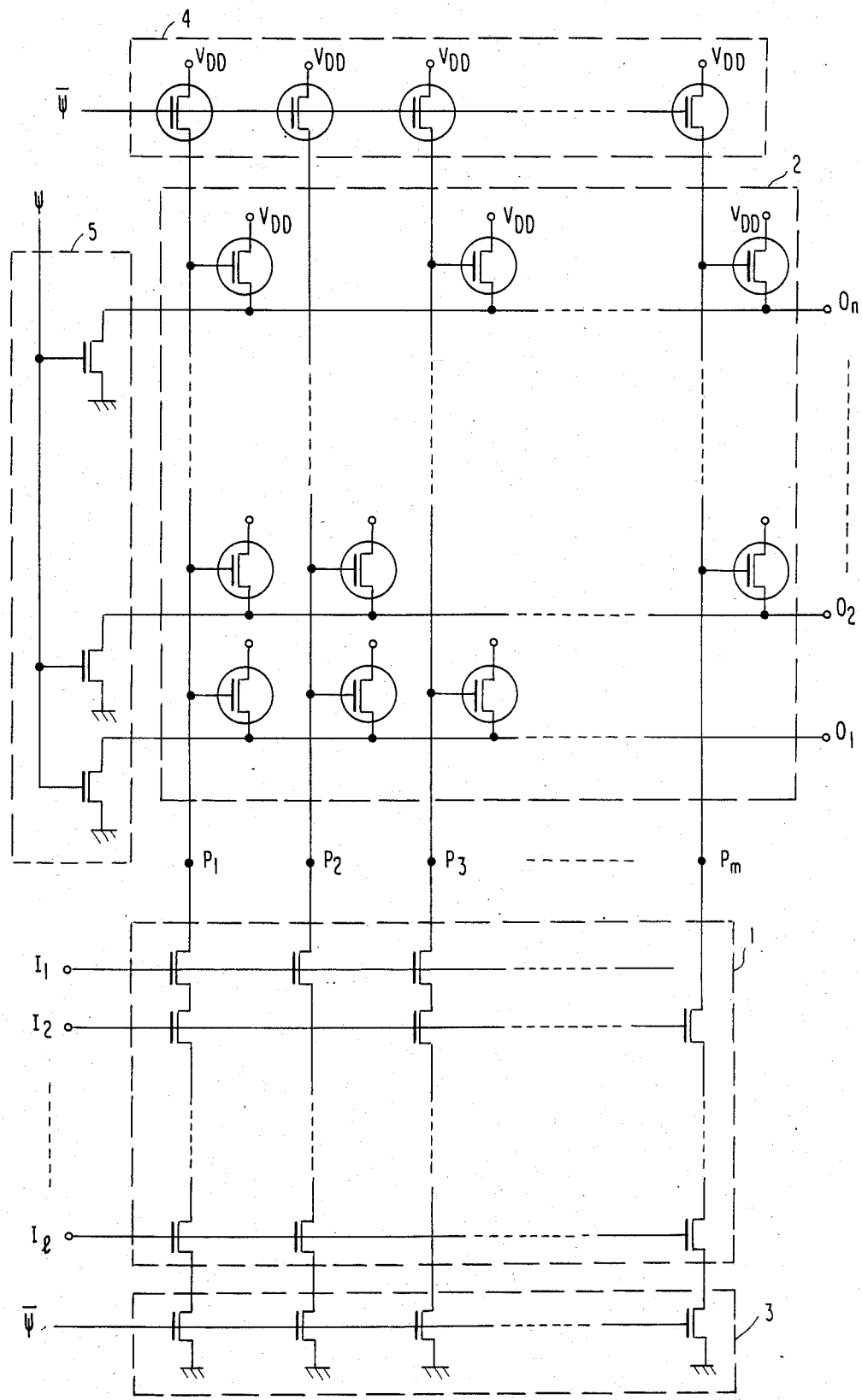
FIG. 1 is a circuit diagram of a conventional PLA circuit.
Figure 2:
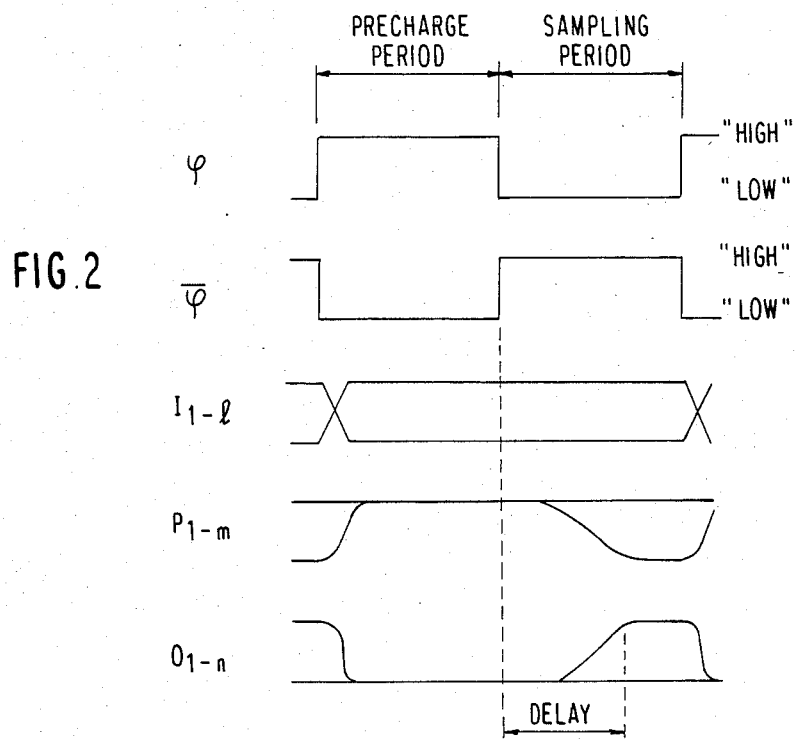
FIG. 2 is a timing chart of the PLA circuit shown in FIG. 1.

FIG. 1 is a conventional PLA circuit in which 1 input signals $I_1$ to $I_l$ are applied to the respective input terminals of a product term array 1 and n output signals $O_1$ to $O_n$ are derived from a sum term array 2. In the product term array, N-channel MOSFETs are arranged according to a logical program, while the sum term array ciomprises an arrangement of P-channel transistors. Output ends $P_1$ to $P_m$ of the product term array 1 are directly connected to the respective input ends of the sum term array 2. A control signal $\Psi$ becomes "high" during a precharge period and becomes "low" during a sampling period. A signal $\bar{\Psi}$ is a complement signal of the $\Psi$ signal. The product circuit 1 is coupled to ground through N-channel sampling MOSFETs, as shown in dotted line block 3. Referring also to FIG. 2, in a precharge period, the control signals $\phi$ and $\bar{\phi}$ take the high and low levels, respectively, and product term output terminals $P_1$ to $P_m$ are charged at $V_{DD}$ potential by a precharge circuit 4 in which the $\Psi$ signal is applied in common to each P-channel precharge MOSFET. Further, output lines connected to output terminals $O_1$ to $O_n$ of the sum term array 2 are discharged at ground potential by a discharge circuit 5 in which the signal is applied in common to each N-channel discharge transistor. Thus, product term lines attain a $V_{DD}$ potential, while sum term lines (output lines) attain a ground potential. At this moment, when input signals $I_1$ to $I_l$ are applied to the product term array, N-channel transistors are turned on according to a pattern of the input signals. In a sampling period, when the signal $\Psi$ becomes high, the N-channel sampling MOSFETs in block 3 are all turned on. Therefore, only the product term output line, in which all N-channel MOSFETs are turned on, is coupled to the ground. Then, $V_{DD}$ potential at the product term output end is discharged toward the ground. For example, if the potential at the output end $P_1$ is discharged, all P-channel MOSFET connected to the output end $P_1$ are turned on. Thus, sum term lines connected to the turned on P-channel MOSFET are coupled to $V_{DD}$ source, and "high" level signals are derived from output terminals $O_1$, $O_2$ and $O_n$.

In this prior art, however, a plurality of P-channel MOSFETs are connected to each product term line and their gate capacitances are coupled to product term output ends $P_1$ to $P_m$. In other words, each output end has a large capacitance and is charged with a large amount of electrical charge. Therefore, when the output end ($P_1$ in the foregoing example) is discharged in the sampling period, a long period of time (delay time) is required for the potential of that end $P_1$ to charge to the low level, as shown by the lower curve of the waveforms of $P_{1-m}$ in FIG. 2. In addition, a plurality of P-channel MOSFETs with a small mutual conductance are connected in parallel to the sum term line, so than an output response is further delayed.

Figure 3:
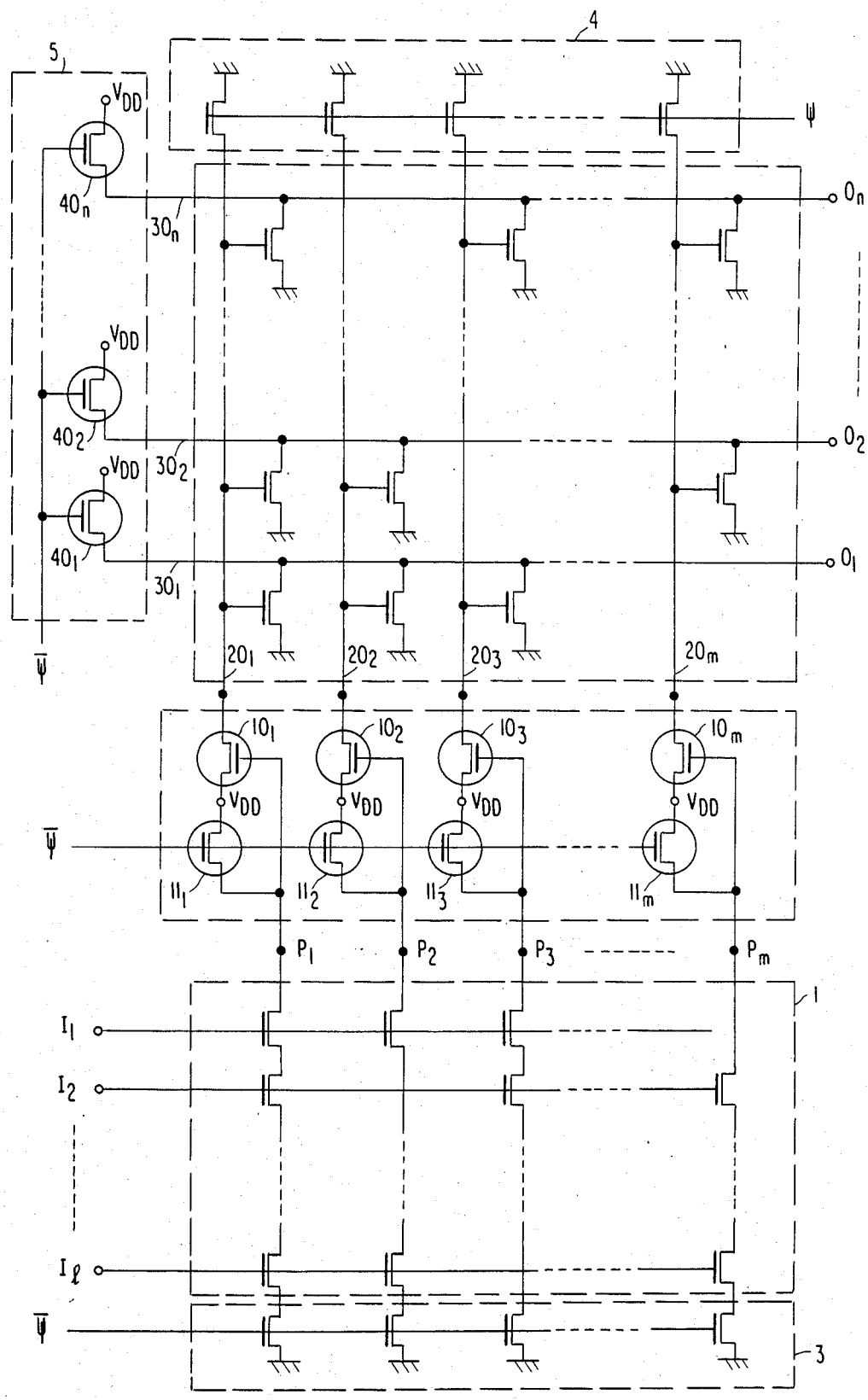
FIG. 3 is a circuit diagram of a PLA circuit according to one embodiment of the present invention.

FIG. 3 is an improved PLA circuit diagram of the present invention in which N-channel MOSFETs are employed in both a product term array 1 and a sum term array 2. The product term array 1 is coupled to a sampling circuit 3. The sum term array 2 is coupled to a circuit 4 in which $\Psi$ signal is commonly applied to all gate electrodes of N-channel transistors coupled to ground. The product term output terminals $P_1$ to $P_m$ are connected to gate electrodes of P-channel control MOSFETs $10_1$ to $10_m$, respctively. Source electrodes of the P-channel control MOSFETs $10_1$ to $10_m$ are coupled to $V_{DD}$, and their drain electrodes are connected to the respective input lines $20_1$ to $20_m$ of the sum term array 2, respectively. The sum term lines $30_1$ to $30_n$ are coupled to $V_{DD}$ via P-channel precharge MOSFETs $40_1$ to $40_n$, respectively in circuit 5. Futher, P-channel precharge MOSFETs $11_1$ to $11_m$ are coupled to the respective product term output terminals $P_1$ to $P_m$.

Figure 4:
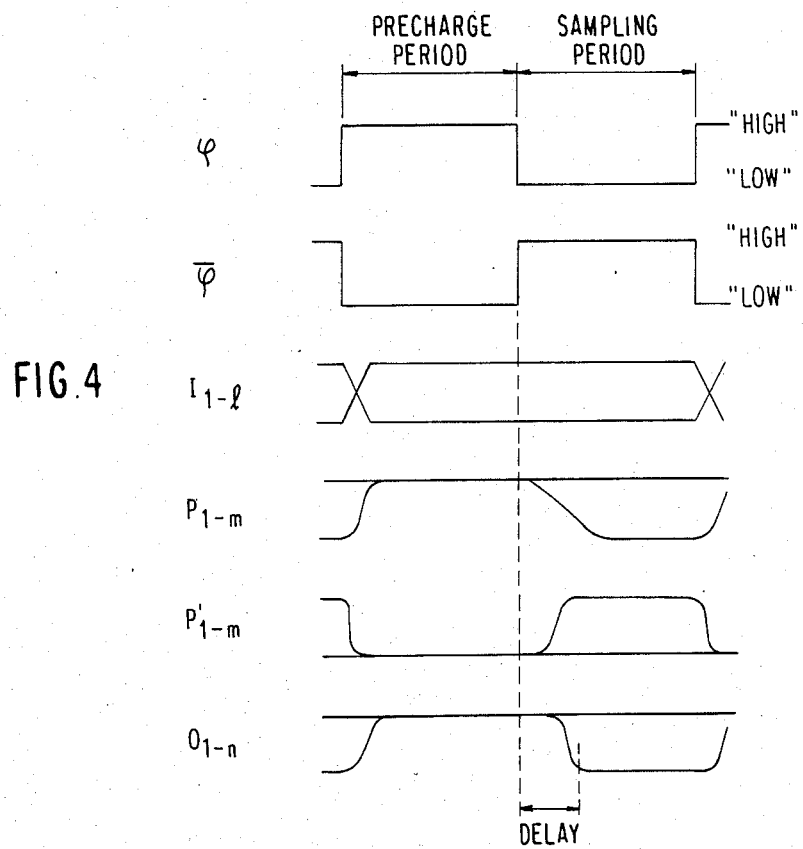
FIG. 4 is a timing chart of the PLA circuit shown in FIG. 3.

Operation of the PLA circuit of FIG. 3 will be described with reference to FIG. 4.

In a precharge period, $\Psi$ signal becomes "high", while $\bar{\Psi}$ signals becomes "low". Accordng to the $\Psi$ and $\bar{\Psi}$ signals, the product term output terminals $P_1$ to $P_m$ are precharged at $V_{DD}$ potential. The sum term lines $30_1$ to $30_n$ are also precharged at $V_{DD}$ potential. However, input lines $20_1$ to $20_m$ of the sum term array 2 are set at ground potential. At this moment, the P-channel control MOSFETs $10_1$ to $10_m$ are turned off because a $V_{DD}$ potential at the product term output terminals $P_1$ to $P_m$ is applied to their gate electrodes.

In a sampling period, $\Psi$ signal becomes "low", while $\bar{\Psi}$ signal becomes "high", so that N-channel MOSFETs in the sampling circuit 3 are turned on, and P-channel MOSFETs $11_1$ to $11_m$ and $40_1$ to $40_n$ are all turned off. In this case, if N-channel MOSFETs coupled in series to the product term output ends $P_1$ to $P_m$ are turned on according to input signals $I_1$ to $I_l$, the potential at $P_1$ to $P_M$ becomes ground potential. Thus, the P-channel control MOSFETs $10_1$ to $10_M$ are turned on. As a result, $V_{DD}$ potential is applied to the input lines $20_1 20m$. Then, N-channel MOSFETs connected to the input lines $20_1$-$20m$ in the sum term array are turned on. The sum term lines $30_1$-$30n$ are coupled to ground, so that a "low" level signal is derived from the output terminal $O_1$.

On the other hand, if at least one N-channel MOSFET coupled to a product term output terminal, $P_1$, for instance, turns off upon receiving a low level signal and $P_1$ rises to $V_{DD}$. Therefore, the P-channel control MOSFET $10_1$, is not turned on. In this case, N-channel MOSFETs connected to the input line $20_1$ are not turned on. Therefore, a "high" level signal is derived from the output terminal $O_1$, in the case in which input lines $20_2$-$20_m$ are also low.

As described above, according to the PLA circuit in FIG. 3, only one gate capacitance of the P-channel control MOSFET is coupled to the respective product term output terminal. Therefore, the P-channel control MOSFETs can quickly respond to the input signals. Further, N-channel MOSFETs can be employed in the sum term array. Since the mutual conductance (gm) of the N-channel MOSFET is large, a delay time on the sum term lines $30_1$ to $30_n$ can be greatly reduced. As a result, a high speed operation can be obtained.

Figure 5:
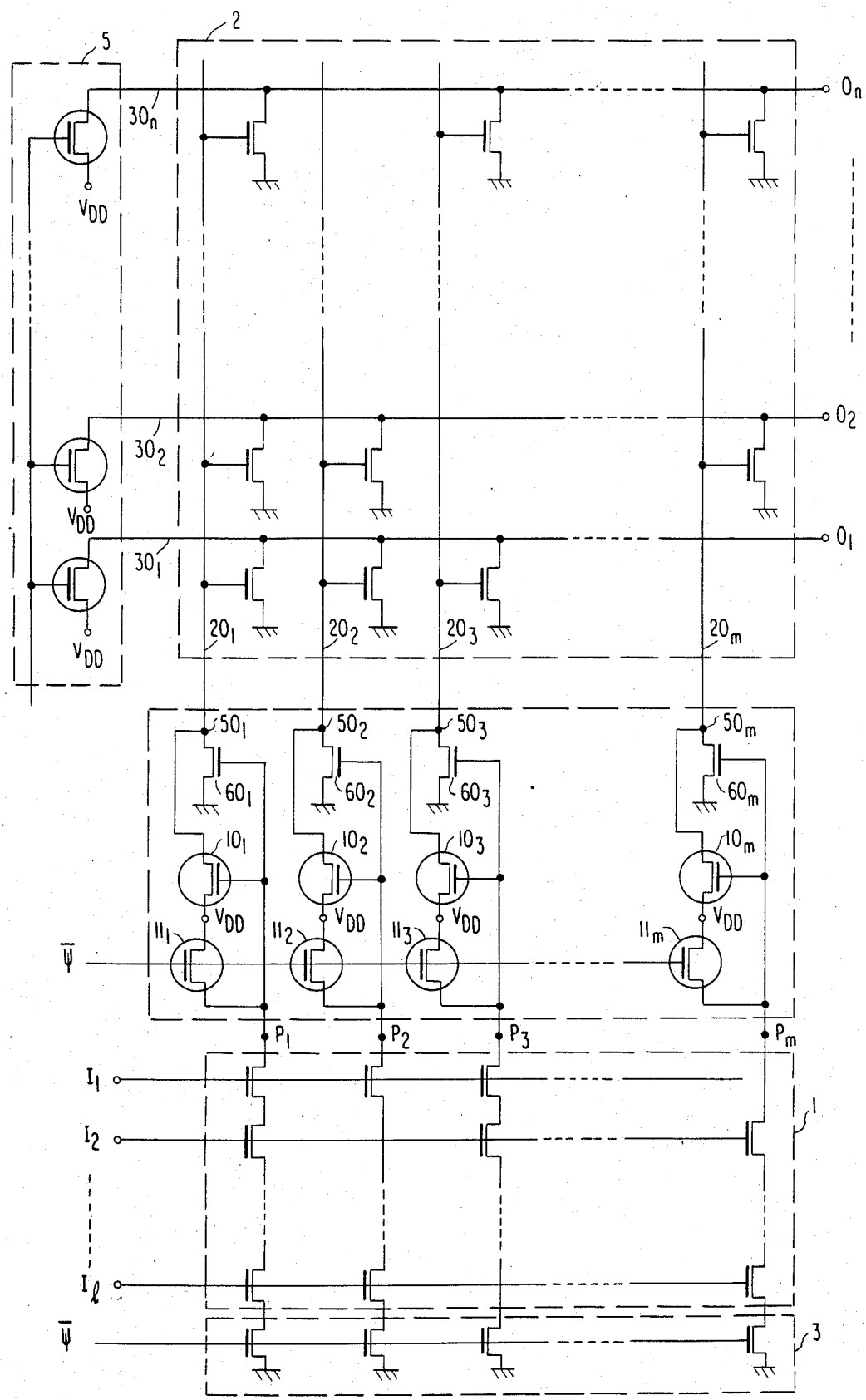
FIG. 5 is a circuit diagram of a PLA circuit according to another embodiment of the present invention.

Furthermore, the PLA circuit in FIG. 3 can be modified as shown in FIG. 5. In this embodiment, N-channel MOSFETs $60_1$ to $60_m$ are provided in place of the N-channel MOSFETs of the circuit 4 in FIG. 3, for discharging the input lines $20_1$ to $20_m$. They are connected to nodes $50_1$ to $50_m$ to which the control transistors $10_1$ to $10_m$ and the input lines $20_1$ to $20_m$ are connected. In detail, one end of each N-channel transistor $60_1$ to $60_m$ is connected to the corresponding one of the nodes $50_1$ to $50_m$ and the other end is connected to the ground. Their gate electrodes are connected to the corresponding output ends $P_1$ to $P_m$ of the product term array. The other end of each input line $20_1$ to $20_m$ is open. The other structure of this embodiment is the same as in FIG. 3. In this embodiment, the N-channel transistors $60_1$ to $60_m$ are all turned on by the precharged high level of the output ends $P_1$ to $P_m$, during the precharge period, to discharge all the input lines $20_1$ to $20_m$ which thus become ground potential. At this time, the P-channel transistors $10_1$ to $10_m$ are turned off to disconnect the input lines $20_1$ to $20_m$ from $V_{DD}$. In the sampling period, one of the output ends $P_1$ to $P_m$ of the product term array is coupled to the ground, and the charge at the corresponding output end is discharged. As a result, the P-channel transistors $10_1$ to $10_m$ and end is connected to the discharged output end is turned on, and the N-channel transistors, connected thereto are turned off, to connect the corresponding one of the input lines $20_1$ to $20_m$ to $V_{DD}$. The N-channel transistors continue to clamp the input lines $20_1$ to $20_m$ to the ground and thereby prevents them from being affected by noises. Each output end of the product term array is coupled with gate capacitances of the two transistors only and, therefore, the discharge speed at the output end in the sampling period is high.

According to this embodiment, the control signal $\Psi$ used in the circuit 4 in FIG. 3 can be omitted, and a static operation can be achieved.

What is claimed is:

1. A programmable logic array circuit comprising a product term array receiving input signals, a sum term array deriving output signals, and control transistors having control electrodes coupled to output ends of said product term array, the source-drain paths of said control transistors being coupled between input ends of said sum term array and a power source.

2. A circuit as claimed in claim 1, in which N-channel transistors are employed in said product term array and in said sum term array, and P-channel transistors are employed as said control transistors.

3. A circuit as claimed in claim 1, further comprising a precharge means for charging product term output ends of said product term array.

4. A circuit as claimed in claim 1, further comprising a sampling circuit coupled to said product term array, said sampling circuit having transistos which are turned on in a sampling period.

5. A programmable logic array for connection to first and second voltage sources comprising:
   a product term array in which N-channel transistors are employed,
   a sum term array in which N-channel transistors are employed,
   a sampling circuit coupled to said product term array for coupling said product term array to said first voltage source in a sampling period,
   a first precharge circuit coupled to said product term array for charging sum term output ends in a precharge period,
   means for selectively coupling input ends of said sum term array to said second voltage source in said sampling period, and
   means coupled to said product term output ends for controlling said coupling means for supplying a predetermined potential to said input ends of said sum term array according to output potentials at output ends of said product term array.

6. A circuit as claimed in claim 5, further comprising means coupled to said input ends of said sum term array for coupling said input ends of said sum term array to said first voltage source in said precharge period.

* * * * *

UNITED STATES PATENT AND TRADEMARK OFFICE
CERTIFICATE OF CORRECTION

PATENT NO. : 4,661,728
DATED : April 28, 1987
INVENTOR(S) : M. KASHIMURA

It is certified that error appears in the above-identified patent and that said Letters Patent is hereby corrected as shown below:

Column 1, line 23, delete "chanel" and insert --channel--;
        line 51, delete "above" and insert --device--;

Column 3, line 18, delete "1" and insert --$\ell$--;
        line 19, delete "$I_1$ to $I_1$" and insert --$I_1$ to $I_\ell$--;
        line 24, delete "ciomprises" and insert --comprises--;
        line 29, delete "$\Psi$" and insert --$\overline{\Psi}$--;
        line 33, delete "$\emptyset$" and insert --$\overline{\emptyset}$--; (second occurrence)
        line 44, delete "$I_1$ to $I_1$" and insert --$I_1$ to $I_\ell$--;

Column 4, line 26, delete "$\Psi$" and insert --$\overline{\Psi}$--; (first occurrence)
        line 27, delete "$\Psi$" and insert --$\overline{\Psi}$--;
        line 36, delete "$\Psi$" and insert --$\overline{\Psi}$--;
        line 41, delete "$I_1$ to $I_1$" and insert --$I_1$ to $I_\ell$--;
        line 44, delete "$20_1 20_m$" and insert --$20_1 - 20_m$--;

Column 5, line 25, delete "and end is";

UNITED STATES PATENT AND TRADEMARK OFFICE
CERTIFICATE OF CORRECTION

PATENT NO. : 4,661,728

DATED : April 28, 1987

INVENTOR(S) : Masahiko Kashimura

It is certified that error appears in the above-identified patent and that said Letters Patent is hereby corrected as shown below:

Column 5, line 26, delete "end is" and insert -- ends are --.

Signed and Sealed this

Twenty-sixth Day of April, 1988

*Attest:*

DONALD J. QUIGG

*Attesting Officer*  *Commissioner of Patents and Trademarks*